(12) United States Patent
McCallister

(10) Patent No.: US 8,064,851 B2
(45) Date of Patent: Nov. 22, 2011

(54) RF TRANSMITTER WITH BIAS-SIGNAL-INDUCED DISTORTION COMPENSATION AND METHOD THEREFOR

(75) Inventor: Ronald Duane McCallister, Scottsdale, AZ (US)

(73) Assignee: Crestcom, Inc., Scottsdale, AZ (US)

( * ) Notice: Subject to any disclaimer, the term of this patent is extended or adjusted under 35 U.S.C. 154(b) by 930 days.

(21) Appl. No.: 12/043,880

(22) Filed: Mar. 6, 2008

(65) Prior Publication Data
US 2009/0227215 A1    Sep. 10, 2009

(51) Int. Cl.
H04B 1/04    (2006.01)
H04B 17/00    (2006.01)

(52) U.S. Cl. ............... 455/114.3; 455/115.1; 455/114.2

(58) Field of Classification Search ............. 455/114.2, 455/114.3, 115.1, 91, 127.1, 127.3; 375/295, 375/296
See application file for complete search history.

(56) References Cited

U.S. PATENT DOCUMENTS

| | | |
|---|---|---|
| 3,426,290 A | 2/1969 | Jensen |
| 3,720,880 A | 3/1973 | Le Seigneur |
| 3,961,280 A | 6/1976 | Sampei |
| 4,054,843 A | 10/1977 | Hamada |
| 4,378,530 A | 3/1983 | Garde |
| 4,507,619 A | 3/1985 | Dijkstra et al. |
| 4,591,803 A | 5/1986 | Saleh |
| 4,831,334 A | 5/1989 | Hudspeth et al. |
| 5,251,330 A | 10/1993 | Chiba et al. |
| 5,272,450 A | 12/1993 | Wisherd |
| 5,420,536 A | 5/1995 | Faulkner et al. |
| 5,929,702 A | 7/1999 | Myers et al. |
| 6,043,707 A | 3/2000 | Budnik |
| 6,049,703 A | 4/2000 | Staudinger et al. |
| 6,081,160 A | 6/2000 | Custer et al. |
| 6,141,541 A | 10/2000 | Midya et al. |
| 6,157,253 A | 12/2000 | Sigmon et al. |
| 6,256,482 B1 | 7/2001 | Raab |
| 6,285,412 B1 * | 9/2001 | Twitchell ............. 348/608 |
| 6,515,712 B1 * | 2/2003 | Jeong ................. 348/608 |
| 6,600,344 B1 | 7/2003 | Newman et al. |
| 6,617,920 B2 | 9/2003 | Staudinger et al. |
| 6,696,866 B2 | 2/2004 | Mitzlaff |
| 6,725,021 B1 | 4/2004 | Anderson et al. |
| 6,775,330 B2 * | 8/2004 | Bach et al. ............ 375/296 |
| 6,792,252 B2 | 9/2004 | Kimball et al. |

(Continued)

OTHER PUBLICATIONS

Raj Desai, "Playing the 3G Power Game", www.Microsemi.com, 1999-2006.

(Continued)

*Primary Examiner* — Sonny Trinh
(74) *Attorney, Agent, or Firm* — Meschkow & Gresham, P.L.C.

(57) ABSTRACT

An RF transmitter (60) generates non-DC bias signals (104, 106) configured to improved power-added efficiency (PAE) in the operation of an RF amplifier (94). The RF amplifier (94) generates an amplified RF signal (126) which, due to the addition of the bias signals (104, 106), includes bias-signal-induced RF distortion (48, 50). The bias signals (104, 106) drive a bias-induced distortion cancellation circuit (152) that adjusts the bias signals to compensate for the influence of impedances experienced by the bias signals (104, 106) before being applied to the RF amplifier (94). After mixing with a baseband communication signal (64), adjusted bias signals (186, 188) are combined into a composite baseband signal (76), upconverted to RF in an upconversion section 84, and applied to the RF amplifier (94) where they cancel at least a portion of the bias-signal-induced RF distortion (48, 50).

18 Claims, 3 Drawing Sheets

U.S. PATENT DOCUMENTS

| | | | |
|---|---|---|---|
| 6,819,720 B1 * | 11/2004 | Willetts | 375/296 |
| 6,831,517 B1 | 12/2004 | Hedberg et al. | |
| 6,882,221 B2 * | 4/2005 | Schreyer et al. | 330/149 |
| 6,914,487 B1 | 7/2005 | Doyle et al. | |
| 6,975,166 B2 | 12/2005 | Grillo et al. | |
| 7,010,280 B1 | 3/2006 | Wilson | |
| 7,026,868 B2 | 4/2006 | Robinson et al. | |
| 7,099,399 B2 | 8/2006 | McCallister | |
| 7,106,134 B2 | 9/2006 | Khanifar et al. | |
| 7,469,491 B2 * | 12/2008 | McCallister et al. | 375/296 |
| 2002/0168025 A1 | 11/2002 | Schwent | |
| 2003/0198300 A1 | 10/2003 | Matero et al. | |
| 2004/0127173 A1 | 7/2004 | Leizerovich | |
| 2004/0198271 A1 | 10/2004 | Kang | |
| 2004/0266366 A1 | 12/2004 | Robinson et al. | |
| 2005/0157814 A1 | 7/2005 | Cova | |
| 2005/0195919 A1 | 9/2005 | Cova | |
| 2005/0227644 A1 | 10/2005 | Maslennikov et al. | |
| 2006/0057980 A1 | 3/2006 | Haque et al. | |
| 2008/0152037 A1 * | 6/2008 | Kim et al. | 375/297 |
| 2009/0097590 A1 * | 4/2009 | McCallister et al. | 375/296 |

OTHER PUBLICATIONS

Brinkhoff, "Bandwidth-Dependent Intermodulation Distortion in FET Amplifiers", Thesis, Submitted to Macquarie University, Dec. 20, 2004, Sydney, Australia.

B.J. Wysocki and T.A. Wysocki, "Orthogonal Binary Sequences with Wide Range of Correlation Properties", ISCTA '01, Ambleside, U.K., Jul. 2001, pp. 483-485.

A. Chan Carusone and D.A. Johns, "Analog Filter Adaptation Using a Dithered Linear Search Algorithm", IEEE Int. Symp. Circuits and Syst., May 2002.

Biranchinath Sahu and Gabriel A. Rincon-Mora, "A High-Efficiency Linear RF Power Amplifier With a Power-Tracking Dynamically Adaptive Buck-Boost Supply", IEEE, 2004, vol. 52.

Cabral, Pedro, and Carvalho, "A Unified Theory for Nonlinear Distortion Characteristics in Different Amplifier Technologies", Microwave Journal, Apr. 2005, Horizon House Pub.

Wang, "CMOS Power Amplifiers for Wireless Communications", 2003, University of California, San Diego.

J. Vuolevi, et al., "Distortion in RF Power Amplifiers", Chapter 7, 2003, Artech House, Inc., Norwood, Massachusetts.

J. Cha, et al., "Memory Effect Minimization and Wide Instantaneous Bandwidth Operation of a Base Station Power Amplifier", Microwave Journal, vol. 5, No. 1, Jan. 2007.

Qun Zhao and Goran Stojcic, "Characterization of Cdv/dt Induced Power Loss in Synchronous Buck DC-DC Converters", Int'l Rectifier, APEC 2004.

Weiss, Raab and Popovich, "Linearity of X-Band Class-F Power Amplifiers in High-Efficiency Transmitters", IEEE, vol. 49, No. 6 Jun. 2001.

Hanington, Chen, Asbeck and Larson, "High-Efficiency Power Amplifier Using Dynamic Power-Supply Voltage for CDMA Application", IEEE vol. 47, No. 8 Aug. 1999.

Schlumpf, Declercq and Dehollain, "A Fast Modulator for Dynamic Supply Linear RF Power Amplifier", IEEE vol. 39, No. 7 Jul. 2004.

Wang, Hueiching, Kimball, Larson and Asbeck, "Design of Wide-Bandwidth Envelope-Tracking Power Amplifiers for OFDM Applications", IEEE, vol. 53, No. 4 Apr. 2005.

Raab, Asbeck, Cripps, Kenington, Popovich, Pothecary, Sevic and Sokal, "RF and Microwave Power Amplifier and Transmitter Technologies-Part 3", Sep. 2003.

Raab, Asbeck, Cripps, Kenington, Popovich, Pothecary, Sevic and Sokal, "Power Amplifiers and Transmitters for RF and Microwave", IEEE, vol. 50, No. 3 Mar. 2002.

Saleh and Cox, "Improving the Power-Added Efficiency of FET Amplifiers Operating with Varying-Envelope Signals", IEEE, vol. 31, No. 1 Jan. 1983.

* cited by examiner

RF TRANSMITTER WITH BIAS-SIGNAL-INDUCED DISTORTION COMPENSATION AND METHOD THEREFOR

RELATED INVENTIONS

This patent is related to: "RF Transmitter with Variably Biased RF Power Amplifier and Method Therefor," filed 2 Jun. 2006, Ser. No. 11/445,816, US Publication No. 2007/0281635, Published 6 Dec. 2007, and to "Distortion-Compensated RF Transmitter and Method Therefor," filed 10 Oct. 2007, Ser. No. 11/870,021, each of which is incorporated herein, in its entirety, by reference.

TECHNICAL FIELD OF THE INVENTION

The present invention relates generally to the field of radio-frequency (RF) transmitters. More particularly, the present invention relates to biasing RF power amplifiers used in RF transmitters and to compensating for distortion which results from the application of bias signals.

BACKGROUND OF THE INVENTION

An RF power amplifier provides the final stage of amplification for a communication signal that has been modulated and converted into an RF signal. The RF signal provided to an RF power amplifier for amplification generally exhibits frequencies confined within a predetermined frequency band licensed by a regulatory agency for a particular use. Many popular modern modulation techniques, such as CDMA, QAM, OFDM, and the like, require the RF power amplifier to perform a linear amplification operation. The degree to which the amplification is not perfectly linear leads to distortion, unwanted intermodulation, and spectral regrowth in the amplified RF signal output from the RF power amplifier.

Spectral regrowth can cause the amplified RF signal output from the RF power amplifier to spill outside the frequency band where the transmitter is licensed to operate. Other forms of distortion, though nevertheless confined within the licensed frequency band, cause deterioration in an error vector magnitude (EVM) parameter of the amplified RF signal output from the RF power amplifier.

While perfect linearity is a goal for any linear RF power amplifier to minimize the pernicious effects of amplifying with an imperfectly linear transfer function, all linear RF power amplifiers invariably full to meet it. Accordingly, a wide variety of schemes have been developed to improve the linearity of imperfectly linear RF power amplifiers used in RF transmitters. Many of these schemes seek to cancel unwanted signal components in the amplified RF signal. Some of these schemes actually introduce out-of-band signals prior to amplification with the goal of cancelling other out-of-band signals generated as a result of imperfectly linear amplification.

Unfortunately, a typical amplified RF signal is an extremely complex composite of wanted and unwanted signal components. The unwanted signal components result from many different distorting effects. As distortion is forced to be a smaller and smaller part of the amplified RF signal, more and more sources of distortion need to be managed. And, the number of combinations and permutations of different signal components that have interacted with one another by being processed through a nonlinear process is intractable. Accordingly, while many diverse schemes have been directed toward the problem of improving RF amplifier linearity, few have actually achieved a highly linear result.

Another trend in RF transmitters, apart from incorporating schemes to improve linearity, is enhancing power-added efficiency (PAE). Power-added efficiency, hereinafter referred to simply as "efficiency", is the ratio of the RF output power to the sum of the input RF power and the applied bias power. In conventional RF transmitters, improvements in efficiency have been achieved at the expense of linearity. In other words, linearity has actually been degraded in order to improve efficiency A variety of RF power amplifier efficiency enhancements has been proposed. These proposals suggest the use of schemes to variably bias the RF power amplifier. Traditionally, "biasing" has referred to DC voltages and currents that are applied to power inputs and signal inputs of amplifiers so that they will reproduce an input signal in a desired manner. The biasing establishes the operating point of the amplifier. Using Lateral Diffusion Metal Oxide Semiconductor (LDMOS) field-effect transistor (FET) terminology, the biasing refers to traditionally DC voltages applied to the drain and gate of an LDMOS, FET, RF power amplifier. But when DC biasing is used, poor efficiency usually results. Accordingly, for variably biased RF power amplifiers, these bias voltages are modulated to achieve improved efficiency with the goal of harming linearity as little as possible. That goal has been difficult to meet.

With the envelope-elimination and restoration (EER) technique, also known as the Kahn technique, the amplitude component of a communication signal is separated from the phase component. Then, the phase component is amplified in a highly efficient amplifier configured for a nonlinear class of operation. The amplitude component is restored by varying the bias voltage at the power input (e.g., the drain) of the nonlinear class amplifier commensurate with the amplitude component of the communication signal. But a significant price is typically paid in linearity by this technique. Accordingly, the EER technique is not readily useable in high power and wide bandwidth applications because, rather than realizing efficiency enhancement, efficiency deterioration is the likely result along with reduced linearity. Efficiency deterioration would result from attempting to generate a high power bias voltage that exhibits a bandwidth consistent with the amplitude content of a wide bandwidth signal.

Another variably biased RF power amplifier technique is the envelope-following technique. Envelope following differs from the EER technique in that both the amplitude and phase components of the communication signal are amplified in a linear-class amplifier. But like the EER technique, power input bias voltage is varied in a manner commensurate with the amplitude content of the communication signal. Accordingly, bias voltage need not be greater than it needs to be to accommodate the RF signal being amplified in a linear class of operation on an instant-by-instant basis. Efficiency enhancements result when compared to traditional linear-class amplifier operation using static DC biasing voltages. Typically, timing issues are less critical than in the EER technique, and the linearity deterioration is less severe than in the EER technique as a result. But a linearity penalty still results, and the envelope-following technique is not readily usable in high power and wide bandwidth applications because, rather than realizing efficiency enhancement, efficiency deterioration is the likely result.

Another variably biased RF power amplifier technique is the envelope-tracking technique. Envelope tracking differs from the envelope-following technique in that the envelope of the RF communication signal is not followed completely. This lowers the switching frequency requirements in the power supply that generates the bias voltage applied to the RF power amplifier's power input, resulting in some efficiency gain to offset an efficiency loss suffered by not completely following the envelope. And, timing issues become less critical, at least in narrow bandwidth applications, so that linearity need not suffer greatly. But a linearity penalty still results, and nothing is provided to ensure that the linearity penalty does not result in the violation of a spectral mask.

The above-referenced Related Inventions discuss yet another variably biased RF power amplifier technique which yields improvements even in a wide bandwidth, high power application. But none of these efficiency techniques are as compatible as desired with a transmitter application that calls for the use of a highly linear or highly linearized RF power amplifier. Accordingly, a need exists for an RF transmitter that better accommodates both variable biasing for its RF power amplifier along with linearization of the RF power amplifier.

SUMMARY OF THE INVENTION

It is an advantage of at least one embodiment of the present invention that an improved RF transmitter with bias-signal-induced distortion compensation and method of operating the RF transmitter are provided.

Another advantage of at least one embodiment of the present invention is that a variably biased RF transmitter and method are provided for use even in a high power, wide bandwidth application.

Another advantage of at least one embodiment of the present invention is that a variably biased RF transmitter and method are provided which decouple, to a large degree, controls provided to improve power-added efficiency from controls provided to improve linearization.

Another advantage of at least one embodiment of the present invention is that an RF transmitter is configured to cancel distortion caused by the use of non-DC signals for biasing an RF power amplifier.

At least some of these and other advantages are realized in one form by an RF transmitter which is compensated for bias-signal-induced distortion. The RF transmitter includes an RF amplifier and a baseband communication signal source. The baseband communication signal source is configured to supply a baseband communication signal. A bias signal generator has an input responsive to the baseband communication signal and is configured to produce a bias signal for the RF amplifier. The bias signal generator has an output coupled to the RF amplifier. A bias adjustment section has an input coupled to the output of the bias signal generator. The bias signal adjustment section is configured to produce an adjusted bias signal. An upconversion section has an input responsive to the adjusted bias signal and an output coupled to the RF amplifier.

At least some of the above and other advantages are realized in another form by a method of operating an RF transmitter having an RF amplifier to compensate for bias-signal-induced distortion. The method calls for providing a baseband communication signal. A bias signal is generated in response to the baseband communication signal, and the bias signal is supplied to the RF amplifier to provide bias for the RF amplifier. The bias signal is adjusted to produce an adjusted bias signal. The adjusted bias signal is upconverted to produce an RF signal. The RF signal is fed to the RF amplifier.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

DETAILED DESCRIPTION OF THE PREFERRED EMBODIMENTS

Figure 1:
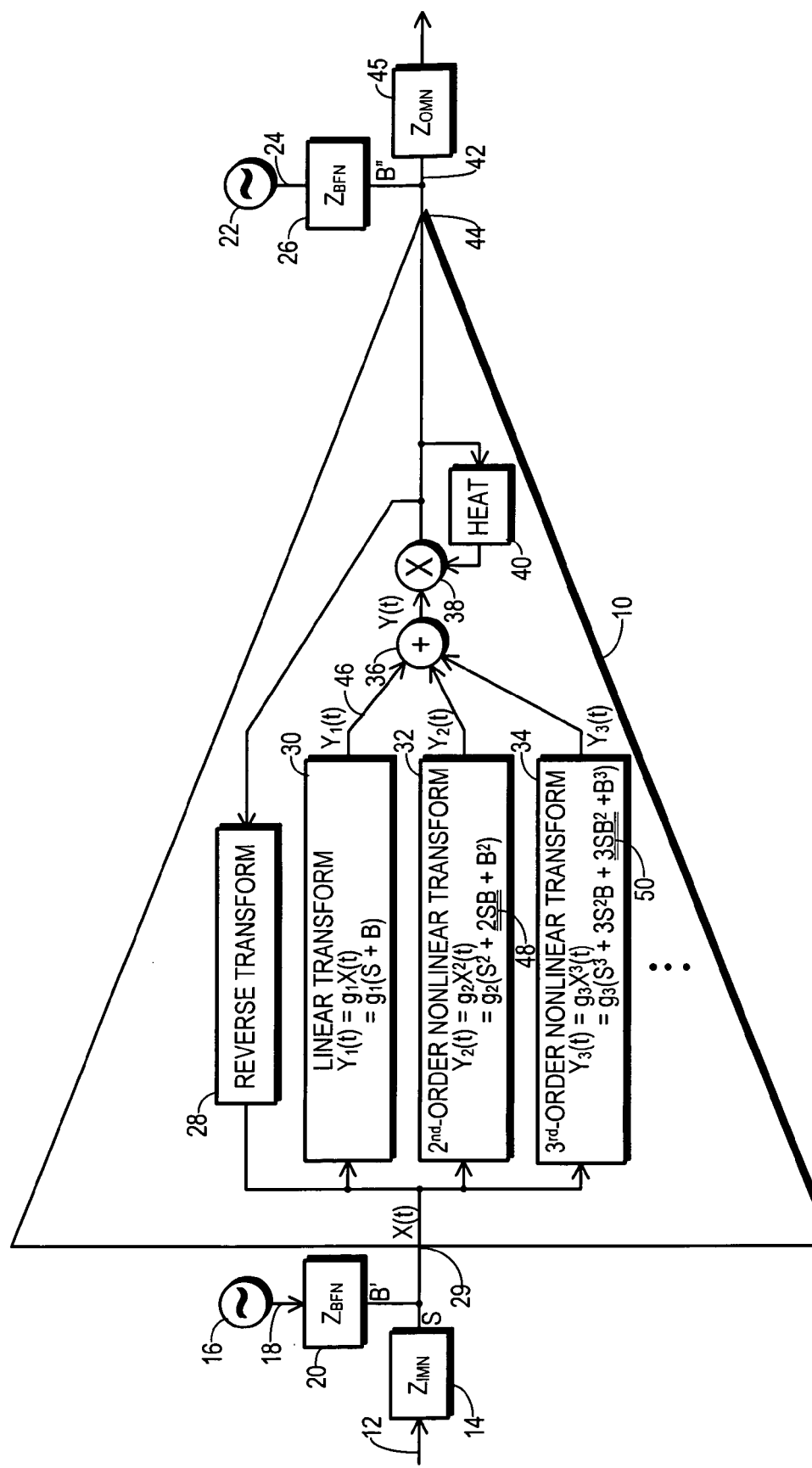
FIG. 1 shows a block diagram of a model which characterizes, at least in part, the performance of an RF amplifier.

FIG. 1 shows a block diagram of a model which characterizes, at least in part, the performance of a generic RF amplifier 10 for purposes of the present discussion. Those skilled in the art will appreciate that the model depicted in FIG. 1 provides a representation of how RF amplifier 10 appears to operate and does not represent an actual physical device. The model of FIG. 1 is provided for purposes of teaching the nature of signals that are relevant to a particular type of distortion introduced through the operation of RF amplifier 10 with non-DC bias signals. Other models may be more suitable for other purposes.

An RF analog communication signal 12 is provided to an input of RF amplifier 10 through an impedance 14 of an input matching network ($Z_{IMN}$). RF communication signal 12 has been modulated to convey the data whose communication is the purpose of a transmitter where RF amplifier 10 resides.

A bias signal generator 16 generates a bias signal 18, and bias signal 18 is provided to an input of RF amplifier 10 through an impedance 20 of a bias feed network ($Z_{BFN}$). Likewise, a bias signal generator 22 generates a bias signal 24, and bias signal 24 is provided to an output of RF amplifier 10 through an impedance 26 of another bias feed network ($Z_{BFN}$). Bias signals 18 and 24 are configured to implement a variable biasing scheme for RF amplifier 10. In other words, one or both of bias signals 18 and 24 vary in a manner that causes RF amplifier 10 to conserve energy, thereby causing RF amplifier 10 to exhibit an improved power-added efficiency (PAE) compared to the PAE that would result from using a static bias. The precise nature and type of variable biasing scheme implemented through bias signal generators 16 and/or 22 is not important. But bias signals 18 and/or 24 are not constant, DC-type bias signals. Typically, bias signals 18 and/or 24 are related in some way to the envelope of RF communication signal 12 so that they vary in concert with RF communication signal 12, but that is not a requirement.

The letters S and B' in FIG. 1 denote signal components for RF communication signal 12 and bias signal 18 respectively. But signal components S and B' do not precisely match RF communication signal 12 and bias signal 18, respectively, because they have been modified by the respective impedances through which they propagate and by the combined impedance present at the input of RF amplifier 10. Likewise, the letter B" denotes a signal component at the output of RF amplifier 10 corresponding to bias signal 24. Signal component B" does not precisely match bias signal 24 because it too has been modified by the impedances it faces.

FIG. 1 shows that RF amplifier 10 is a system of interrelated transfer functions (i.e., transforms). A reverse transform 28 represents one of these interrelated transforms. Accordingly, signal component B" is fed through a reverse transform block 28 to an input 29 of RF amplifier 10. And, signal component B" need not be fed back to the input of RF amplifier 10 only through reverse transform block 28 but may be fed back through other channels outside RF amplifier 10.

Accordingly, the actual signal presented at input 29 of RF amplifier 10 is X(t), where X(t)=S+B and B=f(B',B"). Other components may also be included, but such other components are being ignored for the purposes of this discussion.

RF input signal X(t) is supplied to inputs of a linear transform block 30, a $2^{nd}$-order nonlinear transform block 32, and a $3^{rd}$-order nonlinear transform block 34. The ellipsis in FIG. 1 signifies that additional higher ordered transform blocks may be added to model the behavior of an RF amplifier 10 with increasing precision.

Outputs from transform blocks 30, 32, and 34 are combined in a combination block 36, and an output from combination block 36 is provided to a first input of a multiplier 38. The output of multiplier 38 is fed back to a second input of multiplier 38 through a transform block 40 that characterizes the influence of temperature on RF amplifier 10. In general, multiplier 38 and heat transform block 40 characterize a droop in output that tends to be observed as temperature increases due to self heating and the ambient temperature, all other parameters remaining equal. The output from multiplier 38 also supplies amplified RF signal 42 from output 44 of RF amplifier 10 across the bias feed network impedance 26 ($Z_{BFN}$) and through an impedance 45 which characterizes an output matching network ($Z_{OMN}$). Bias signal B" is also one of the components of amplified RF signal 42, and it is the complete composite amplified RF signal 42 that is fed through reverse transform block 28.

FIG. 1 illustrates that amplified RF signal 42 is a combination of a variety of related signals or components. Desirably, the most dominant signal components in amplified RF signal 42 are a linear RF signal 46 and biasing (B). Linear RF signal 46 represents the desired component of amplified RF signal 42. Linear RF signal 46 is denoted as $Y_1(t)$, where $Y_1(t)=g_1X(t)$, and also equals $g_1(S+B)$, where B=f(B',B"), and $g_1$ denotes a gain factor. Linear RF signal 46 is linearly related to X(t) and does not expand the bandwidth of X(t). While biasing (B) is present in amplified RF signal 42, biasing tends to spectrally reside near DC and have a bandwidth much less than the carrier frequency for linear RF signal 46. Thus, biasing (B) is easily separated from linear RF signal 46 in the output matching network due to the vast frequency difference between these two components.

Spurious signals or signal components are also simultaneously generated and combined with linear RF signal 46 to form amplified RF signal 42. FIG. 1 illustrates that $Y_2(t)$ and $Y_3(t)$ respectively represent second order and third order functions of X(t). Desirably, $Y_2(t)$ and $Y_3(t)$ are decreasingly less prominent than linear RF signal 46.

The $Y_2(t)$ and $Y_3(t)$ spurious signals are unwanted and referred to as distortion. While spurious signals at frequencies higher than the RF fundamental are unwanted, they too can often be attenuated through the use of passive RF components conventionally used in matching networks, bias feed networks, transmission lines, and the like. But spurious signals that fall near the fundamental RF signal are difficult to attenuate because techniques and processes aimed at such signals tend to affect the fundamental RF signal as well.

Thus, as a result of $2^{nd}$-order nonlinear transform block 32, a second-order harmonic term ($S^2$), a fundamental term 48 (2SB) and a baseband term ($B^2$) are generated. And, as a result of $3^{rd}$-order nonlinear transform block 34, a third-order harmonic term ($S^3$), a second-order harmonic term ($3S^2B$), a fundamental term 50 ($3SB^2$), and a baseband term ($B^3$) are generated. The second and third harmonic terms and the baseband terms do not directly pose serious problems because they tend to be spectrally located in entirely different portions of the spectrum from linear RF signal 46 and can therefore be easily separated from the fundamental.

But fundamental terms 48 and 50 result from the addition of bias signals B to fundamental signal S at input 29 of RF amplifier 10, and represent bias-signal-induced RF distortion. The bias-signal-induced RF distortion of terms 48 and 50 is more difficult to remove than baseband and higher order components because it is spectrally located around the fundamental frequency of the signal S. The bandwidth of bias-signal-induced RF distortion component 48 extends above and below the bandwidth of RF communication signal 12 by the bandwidth of the combined bias signal B, and the bandwidth of component 50 extends above and below the bandwidth of RF communication signal 12 by twice the bandwidth of the combined bias signal B.

Each of fourth and higher order transforms would also include fundamental-frequency, bias-signal-induced RF distortion components, but such components are likely to be significantly less prominent than the bias-signal-induced RF distortion components 48 and 50 generated due to second and third order transforms 32 and 34.

As the bandwidth of bias signals 18 and 24 increases, the distorting influence of bias-signal-induced RF distortion components 48 and 50 likewise increases. Thus, when bias signals 18 and 24 are constant DC signals, RF amplifier 10 experiences substantially none of the type of distortion characterized by terms 48 and 50, but the PAE of RF amplifier 10 is undesirably poor. As the bandwidth for signals 18 and/or 24 increases, the PAE improves, but the distortion characterized by terms 48 and 50 increases. And as the bandwidth for signals 18 and/or 24 increases, spectral regrowth worsens.

Figure 2:
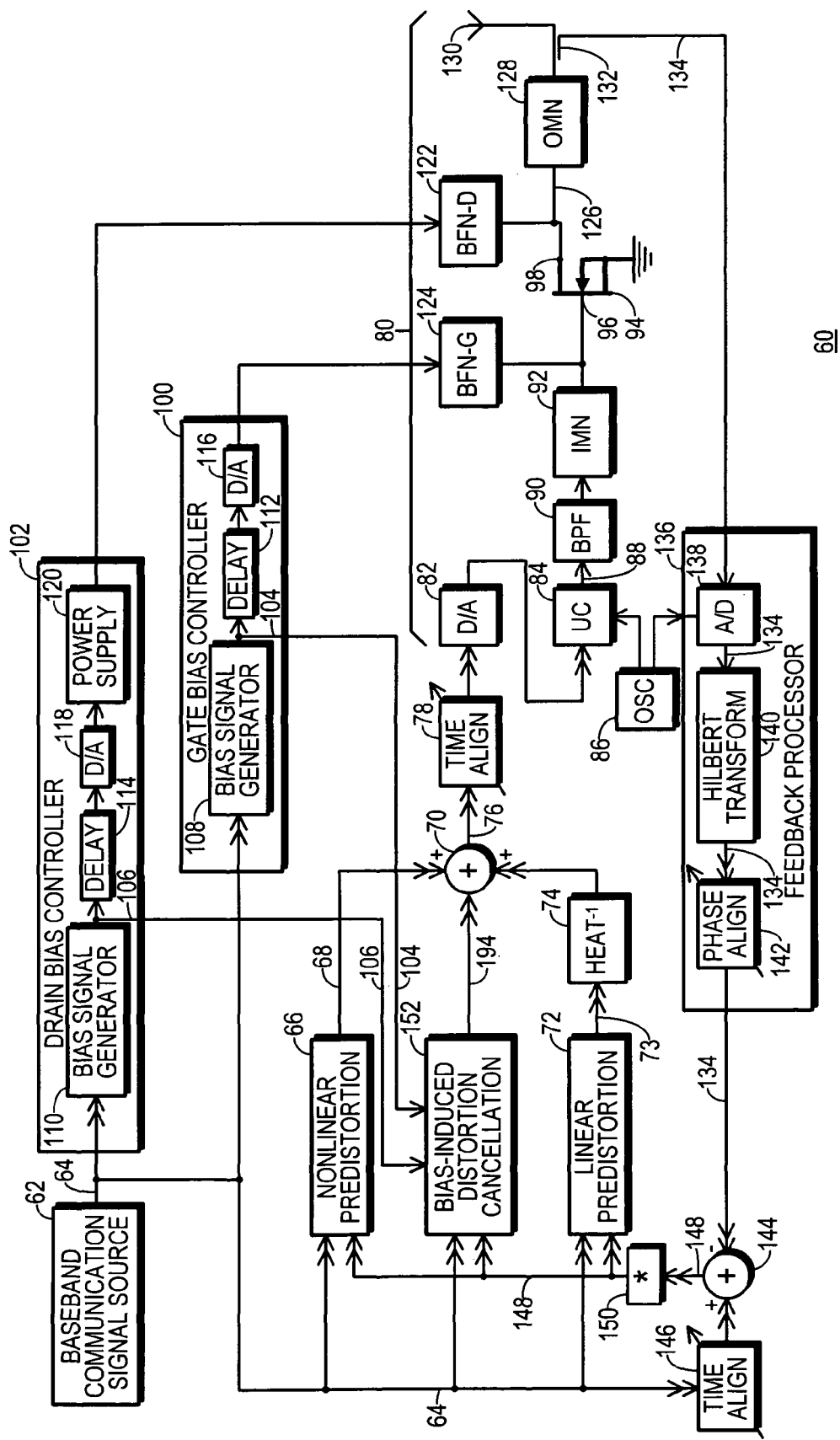
FIG. 2 shows a block diagram of an RF transmitter configured in accordance with the teaching of one embodiment of the present invention.

FIG. 2 shows a block diagram of an RF transmitter 60 configured to compensate for bias-signal-induced RF distortion, such as results from terms 48 and 50 (FIG. 1), in accordance with the teaching of one embodiment of the present invention. RF transmitter 60 includes a baseband communication signal source 62. Baseband communication signal source 62 provides a digitally modulated, complex, baseband version of a communication signal, referred to below as baseband communication signal 64.

Baseband communication signal source 62 may perform any number of activities well known to those skilled in the art of digital RF transmitters. For example, raw data to be transmitted from RF transmitter 60 may be digitally modulated using a suitable form of digital modulation, such as QPSK, CDMA, OFDM, or the like. The benefits of the present invention are best appreciated when the digital modulation calls for linear amplification downstream in an RF amplifier. Multiple data streams may have been digitally modulated and combined together for transmission, as occurs in a cellular base station. The digitally modulated signal may have been pulse-shaped to limit bandwidth while minimizing intersymbol interference (ISI). Additional processing may have been performed to reduce the peak-to-average power ratio. Any or all of these and other types of signal processing activities may be performed at baseband communication signal source 62. As a result of the processing performed at baseband communication signal source 62, baseband communication signal 64 is a digitally modulated, complex signal that substantially exhibits the bandwidth allocated to RF transmitter 60 for the transmission of RF energy. This bandwidth resides at baseband (i.e., near DC). Desirably, baseband communication signal 64 is an analytic signal having a bandwidth centered at or near 0 Hz. In one embodiment, communication signal 64 is a wideband multi-channel signal, having a bandwidth of around 20 MHz, but this particular bandwidth is not a requirement of the present invention. The figures symbolize the complex nature of baseband communication signal 64 and of other complex signals within RF transmitter 60 using a double-arrowhead notation.

Baseband communication signal 64 drives a nonlinear predistortion section 66, where it is spectrally processed to introduce out-of-band predistortion (e.g., distortion over a bandwidth larger than that of communication signal 64 and outside the licensed frequency band for RF transmitter 60).

In one embodiment, nonlinear predistortion section 66 desirably generates a plurality of higher-order basis functions in response to baseband communication signal 64. The basis functions are functionally related to baseband communication signal 64 in a nonlinear way. In one example, one basis function is roughly equal to I*M(I), and another basis function is roughly equal to I*M(I)*M(I), where "I" represents the input signal (e.g., baseband communication signal 64) and "M(I)" represents the magnitude of the input signal. Nonlinear predistortion section 66 desirably equalizes the basis functions through independent adaptive equalizers (not shown), then combines and delays the equalized basis functions to form a nonlinear predistorted signal 68. Nonlinear predistorted signal 68 is applied to a first input of a combiner 70.

The adaptive equalizers in nonlinear predistorter 68 desirably adapt equalizer coefficients in response to LMS-based, estimation-and-convergence algorithms. In other words, the adaptive equalizers desirably estimate equalizer coefficient values that will influence the amount of a form of nonlinear distortion in a signal output from RF transmitter 60, and then alter the coefficients over time in accordance with an LMS algorithm to achieve decreasing amounts of nonlinear distortion until convergence is reached at a minimum amount of nonlinear distortion. The estimation-and-convergence algorithms are based upon feedback obtained from an RF amplifier located downstream. The form of nonlinear distortion compensated for through nonlinear predistorter 66 is not the bias-signal-induced distortion of terms 48 and 50 (discussed above).

Those skilled in the art will appreciate that the above-discussed equalizer-based nonlinear predistorter 68 is not the only type of nonlinear predistorter that may be satisfactorily used in RF transmitter 60. For example, an alternate embodiment may satisfactorily use a table-based implementation.

Baseband communication signal 64 also drives a linear predistortion section 72, where it is spectrally processed to introduce in-band predistortion (e.g., distortion within the bandwidth of baseband communication signal 64). In one embodiment, linear predistortion section 72 uses an adaptive equalizer to apply a linear predistortion transformation function to baseband communication signal 64. As with the above-discussed embodiment of nonlinear predistortion section 66, linear predistortion section 72 desirably adjusts equalizer coefficients in response to an LMS based estimation-and-convergence algorithm. The adaptive equalizer of linear predistortion section 72 desirably estimates equalizer coefficient values that will influence the amount of linear distortion in the signal output from the RF amplifier located downstream, then alters these coefficients over time to adjust the predistortion transformation function applied by the adaptive equalizer and to achieve decreasing amounts of linear distortion until convergence is reached at a minimum amount of linear distortion.

After predistortion in linear predistortion section 72, the linearly predistorted version 73 of baseband communication signal 64 is applied to an input of a heat compensator 74 (HEAT$^{-1}$). Heat compensator 74 compensates for gain-droop distortion caused by heating in an RF amplifier, as modeled by heat transform block 40 (FIG. 1). An output of heat compensator 74 provides a linearly predistorted form of baseband communication signal 64 to a second input of combiner 70. Although not shown, the data rate of the linearly predistorted baseband communication signal 64 may be stepped up to match the greater data rate of nonlinear predistorted signal 68 prior to application at combiner 70. Nonlinear predistorted signal 68 exhibits a greater data rate to support the higher bandwidth needed to adequately convey the higher-order basis functions generated in nonlinear predistortion section 66. Although not shown, delays are introduced into one or both of the linearly predistorted baseband communication signal 64 and nonlinear predistorted signal 68 so that the two signals are temporally aligned at combiner 70.

After combiner 70, baseband communication signal 64, now predistorted to address linear distortion and configured as a composite baseband signal 76 which includes components configured to address other forms of distortion, passes through a variable, differential-mode, time alignment section 78. Differential time alignment refers to relative delay inserted into one of the in-phase and quadrature-phase legs of the complex baseband communication signal. Section 78 may be implemented using a fixed delay of less than one clock interval in one of the legs of composite baseband signal 76 and an interpolator in the other.

After differential timing adjustment in section 78, composite baseband signal 76 passes to analog transmitter components 80. Analog transmitter components 80 include separate digital-to-analog (D/A) converters 82 for each leg of the complex composite baseband signal 76. D/As 82 convert composite baseband signal 76 from digital signals into analog signals. Subsequent processing of the communication signal will now be analog processing and subject to the inaccuracies characteristic of analog processing. For example, the two different D/A's 82 may not exhibit precisely the same gain and may introduce slightly different amounts of delay. Such differences in gain and delay can lead to linear distortion in the signal transmitted from RF transmitter 60. Moreover, so long as the different legs of the complex signal are processed separately in different analog components, the components are likely to apply slightly different frequency responses so that linear distortion is worsened by the introduction of frequency-dependent gain and phase imbalances. And, the frequency-dependent gain and phase imbalances worsen as the bandwidth of the communication signal widens.

The two complex legs of the analog signal pass from D/A's 82 to two low-pass filters (not shown), which can be the source of additional linear distortion by applying slightly different gains and phase shifts in addition to slightly different frequency-dependent characteristics. Then, the two complex legs pass to an upconversion section 84. Upconversion section 84 mixes the two complex legs with a local-oscillator signal from an oscillator section 86 (OSC) in a manner known to those skilled in the art. Additional linear distortion in the form of gain and phase imbalance may be introduced, and local-oscillator leakage may produce an unwanted DC offset. In addition, upconversion section 84 combines the two distinct legs of the complex signal and passes the combined signal, now referred to as RF signal 88, to a band-pass filter (BPF) 90.

BPF 90 is configured to block unwanted sidebands in RF signal 88, but will also introduce additional distortion. RF signal 88 then passes from BPF 90 through input matching network (IMN) 92 to an input 96 of an RF amplifier 94. Although not shown, a driver amplifier stage may also be included upstream of input 96 to RF amplifier 94.

RF amplifier 94 may be provided by any amplifying device or collection of devices known to those skilled in the art. FIG. 2 depicts RF amplifier 94 as being a field effect transistor (FET), and indeed, an LDMOS FET is one popular type of amplifying device that may be used as RF amplifier 94. But those skilled in the art will appreciate that other amplifying devices, including bipolar transistors, heterojunction transistors, electron tubes, other types of FETs, and the like may also serve as RF amplifier 94. And, "N" or "P" conductivity types may also characterize the amplifying device that serves as RF amplifier 94. An input 96 of RF amplifier 94 may be provided by a control terminal of the amplifying device, such as a gate of a FET or a base of a transistor. An output 98 of RF amplifier 94 may be provided by a conduction terminal of the amplifying device. The embodiment depicted in FIG. 2 shows a drain of a FET as the conduction terminal which serves as output 98 of RF amplifier 94. But a different type of amplifying device may use a source, or either a collector or emitter if the amplifying device is a bipolar transistor rather than a FET. The following discussion will use terminology consistent with the specific embodiment presented in FIG. 2, namely where RF amplifier 94 is a FET, its input is a gate, and its output is a drain, but those skilled in the art will appreciate that other labels may be applied to amplifier inputs and outputs in other applications.

Baseband communication signal 64 output from baseband communication signal source 62 also drives a gate bias controller 100 and a drain bias controller 102. Bias controllers 100 and 102 respectively generate bias signals 104 and 106 intended for input 96 and output 98 of RF amplifier 94. In particular, bias signal generators 108 and 110, respectively located in gate bias controller 100 and drain bias controller 102, each have inputs responsive to baseband communication signal 64.

Bias controllers 100 and 102 may be implemented in a manner consistent with conventional bias control circuits known to those skilled in the art. In order to improve the power added efficiency (PAE) of RF amplifier 94, one or both of bias controllers 100 and 102 may generate its bias signal 104 and/or 106 to roughly track the envelope of the modulating signal, baseband communication signal 64. Usually, static DC bias yields poor PAE, so desirable bias signals 104 and/or 106 are non-DC signals. When one or more of bias controllers 100 and/or 102 roughly track the modulating signal envelope, it is desirable that the bias controllers 100 and/or 102 implement a process which causes bias signals 104 and/or 106 to exhibit a bandwidth less than the bandwidth of baseband communication signal 64. Otherwise, more energy may be consumed downstream of bias controllers 100 and 102 in generating the higher current analog bias signals than is saved by operating RF amplifier 94 more efficiently. Bias signals 100 and 102 may, but are not required to, exhibit different bandwidth characteristics from each other. For example, drain bias signal 106 may exhibit a lower bandwidth than gate bias signal 104 due to the challenges of efficiently generating bias signals of greater current that are fed to an RF amplifier drain than to an RF amplifier gate.

One adequate form of bias signal generator 100 and/or 102 achieves the following three goals. First, a bias signal 104 or 106 should remain at greater amplitude than the envelope of baseband communication signal 64 for substantially all samples. Second, a bias signal 104 or 106 should remain at as low an amplitude as possible for as long as possible without violating the first goal. And third, a bias signal 104 or 106 should exhibit a fundamental frequency sufficiently low that an analog signal suitable for biasing RF amplifier 94 can be generated to track it, without violating the first and second goals. Bias signal generators 100 and 102 may be configured follow these three goals, or in any other manner known to those skilled in the art. But, regardless of the particular generating function followed, the resulting bias signal 104 and/or 106 is unlikely to be linearly related to baseband communication signal 64 or its higher-ordered basis functions. Consequently, predistortion activities of linear predistortion section 72 and of nonlinear predistortion section 66 are unlikely to be effective in compensating for the bias-signal-induced distortion of terms 48 and 50 (FIG. 1).

Bias signals 104 and 106 are respectively delayed in delay elements 112 and 114, then converted into analog signals in digital-to-analog (D/A) converters 116 and 118. The analog form of drain bias signal 106 is used to control a power supply 120 to achieve the higher power levels needed to bias the output of RF amplifier 94, and then a higher power version of drain bias signal 106 output from power supply 120 passes through a bias feed network 122 to the drain of RF amplifier 94. The analog form of gate bias signal 104 passes more directly through a bias feed network 124 to the gate of RF amplifier 94.

Bias feed networks 122 and 124 may be implemented in a manner consistent with conventional bias feed networks known to those skilled in the art. Desirably, bias feed networks 122 and 124 are each configured so that their impedance varies with frequency. For example, bias feed networks 122 and 124 may desirably exhibit relatively low impedance at baseband frequencies, relatively high impedance at the fundamental of the RF frequency, and relatively low impedance at a second harmonic of the RF frequency. Bias feed networks 122 and 124 may include quarter wavelength (for RF signal 88) transmission lines and one or more capacitor terminators to accomplish these goals. But other architectures for bias feed networks 122 and 124 may also be used. As discussed above in connection with FIG. 1, bias signals 104 and 106 which are generated by bias signal generators 108 and 110 get modified by bias feed networks 124 and 122 before being applied to RF amplifier 94 due to the impedances of networks 124 and 122 and the other impedances that are present at the input and output of RF amplifier 94.

RF amplifier 94 generates an amplified RF signal 126 at the output 98 of RF amplifier 94. Amplified RF signal 126 passes from output 98, through an output matching network (OMN) 128, to an antenna 130. But a directional coupler 132 is positioned upstream of antenna 130 to extract a portion of amplified RF signal 126 for use as a feedback signal 134. Those skilled in the art will appreciate that amplified RF signal 126 may pass through other components prior to antenna 130. For example, amplified RF signal 126 may also pass through a duplexer (not shown), and the duplexer may be located upstream or downstream of directional coupler 132. Conventional architectures known to those skilled in the art may be used for input and output matching networks 92 and 128.

Feedback signal 134 is supplied from directional coupler 132 to a first input of a feedback processor 136. In particular, feedback signal 134 is supplied to an analog-to-digital converter (A/D) 138 of feedback processor 136, where feedback signal 134 is converted into a digital form. Desirably, A/D 138 couples to oscillator 86 so that A/D 138 samples coherently with the local oscillator used by upconversion section 84. Moreover, the sampling rate is controlled to achieve a digital, subharmonic, sampling downconversion of feedback signal 134 into a baseband form. This digital baseband form of feedback signal 46 is supplied to a Hilbert transform circuit 140, where it is converted into a complex, analytic signal having in-phase and quadrature-phase components. The use of digital, subharmonic sampling for downconversion is desirable, but not a requirement, for the generation of a complex baseband signal because it reduces biases that result from the use of analog components in separate signal paths to perform a more conventional downconversion.

The baseband form of feedback signal 134 passes from Hilbert transform circuit 140 to a variable phase alignment section 142. From section 142, feedback signal 134 passes to a subtraction input of a combiner 144.

Baseband communication signal 64 output from baseband communication signal source 62 also drives a variable time alignment section 146. An output of section 146 couples to an addition input of combiner 144. Time alignment section 146 temporally aligns a delayed version of baseband communication signal 64 with feedback signal 134 at combiner 144. Variable phase alignment section 142 is adjusted to alter the phase of the baseband form of feedback signal 134 so that its phase substantially matches the phase of delayed baseband communication signal 64 at combiner 144. Desirably, variable phase alignment section 142, and variable time alignment section 146 are each adjusted so that the correlation between the delayed form baseband communication signal 64 and the baseband form of feedback signal 134 is maximized.

Combiner 144 forms an error signal 148. Essentially, baseband communication signal 64 represents a baseband version of the ideal signal RF amplifier 94 should produce, and error signal 148 conveys the distortion, including the bias-signal-induced distortion of terms 48 and 50 (FIG. 1), included in amplified RF signal 126. A conjugation section 150 forms the conjugate of error signal 148, and this conjugate form of error signal 148 drives inputs of linear predistortion section 72 and nonlinear predistortion section 66. It is error signal 148 that drives adaptation loops within sections 72 and 66 to minimize linear and nonlinear distortion. Linear and nonlinear predistortion sections 72 and 66 adapt equalizer coefficients in a way that minimizes the distortion indicated by error signal 148.

Those skilled in the art will appreciate that in minimizing distortion, linear and nonlinear predistortion sections 72 and 66 will invariably full to achieve an absolutely minimum amount of distortion achievable. Rather, linear and nonlinear predistortion sections 72 and 66 continually and/or repeatedly make adjustments that are designed to reduce the distortion. But some types of distortion are not linearly related to baseband communication signal 64 or to higher-ordered basis functions of baseband communication signal 64. The bias-signal-induced distortion of terms 48 and 50 represent such distortion.

Accordingly, RF amplifier 60 includes a bias-induced distortion cancellation section 152 which is configured to minimize bias-signal-induced distortion, such as that of terms 48 and 50 (FIG. 1). As with linear and nonlinear predistortion sections 72 and 66, bias-induced distortion cancellation section 152 does not actually achieve an absolutely minimum amount of bias-signal-induced distortion but rather continuously or repeatedly makes adjustments that are designed to reduce the distortion.

A first input of bias-induced distortion cancellation section 152 receives and is responsive to baseband communication signal 64, a second input receives and is responsive to the conjugated form of error signal 148, and an output of section 152 couples to a third input of combiner 70 so that combiner 70 and composite baseband signal 76 are responsive to an adjusted bias signal produced by section 152. In addition, the digital form of gate and drain bias signals 104 and 106 respectively couple to inputs of section 152.

Figure 3:
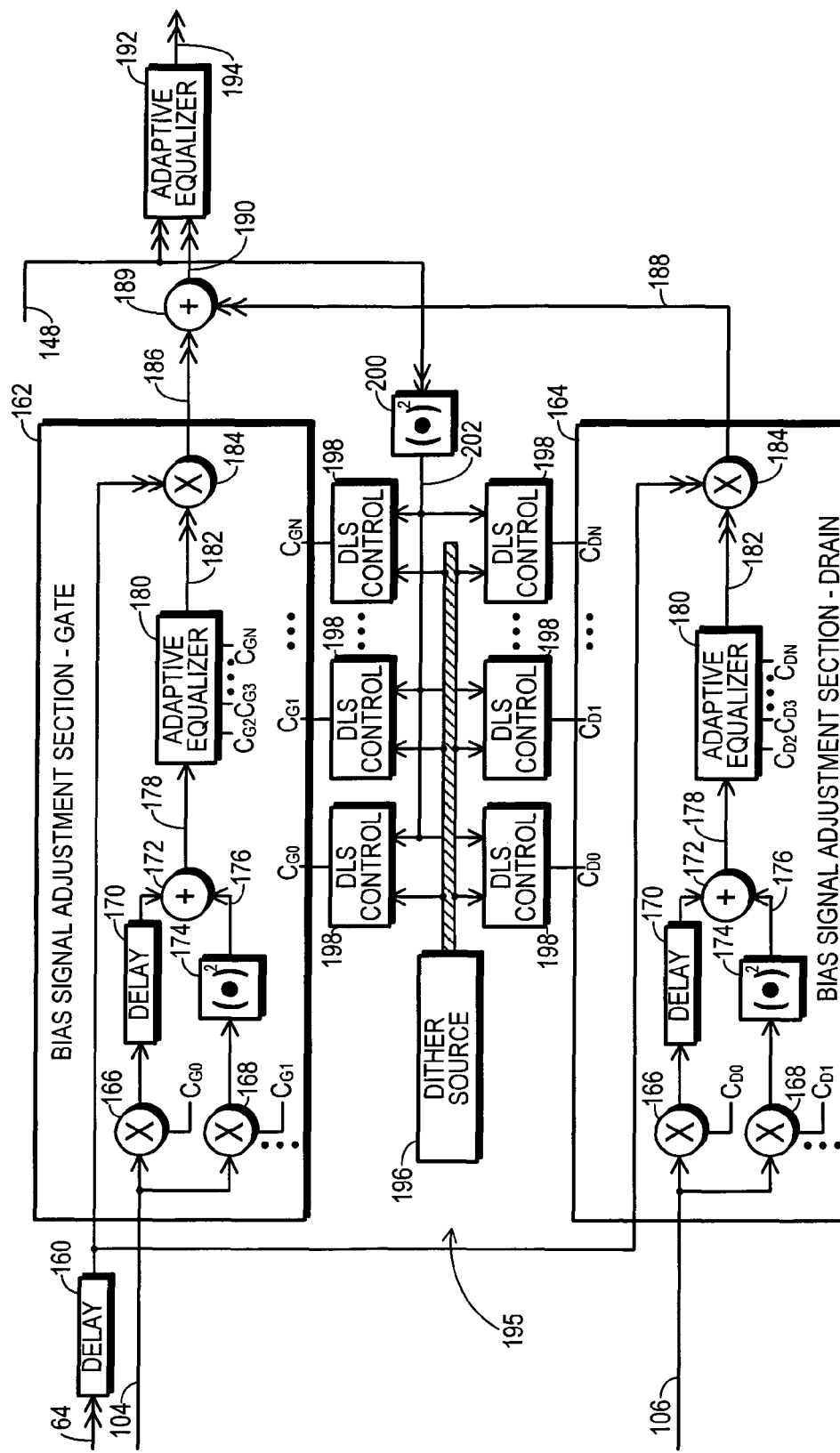
FIG. 3 shows a block diagram of a bias-induced distortion cancellation section of the RF transmitter of FIG. 2.

FIG. 3 shows a block diagram of bias-induced distortion cancellation section 152 configured in accordance with one embodiment of the present invention. Referring to FIGS. 2 and 3, RF transmitter 60 generally forms an RF cancellation signal that is included in RF signal 88, and that cancels, and desirably cancels to a significant degree, the bias-signal-induced distortion of terms 48 and 50 (FIG. 1). For each of bias signals 104 and 106, adjustments are made which roughly compensate for the modifications made to bias signals 104 and 106 as they pass through feed networks 124 and 122. Then, the adjusted bias signals are multiplied by baseband communication signal 64 to form mixed signals having the same form as terms 48 and 50. And, the mixed signals are then combined into composite baseband signal 76 and upconverted to RF in upconversion section 84.

Specifically, baseband communication 64 is fed through a delay element 160 to respective inputs of bias signal adjustment sections 162 and 164 for gate bias signal 104 and for drain bias signal 106. The following discussion focuses on gate bias signal adjustment section 162. But gate bias signal adjustment section 162 is configured substantially the same as drain bias signal adjustment section 164 in the preferred embodiment. Thus, the following discussion also applies to drain bias signal adjustment section 164, except that the orientation for drain bias signal adjustment section 164 is the drain, rather than the gate, of RF amplifier 94.

Bias signal 104 drives first inputs of multipliers 166 and 168. Second inputs of multipliers 166 and 168 are driven by control signals $C_{G0}$ and $C_{G1}$. Control signals $C_{G0}$ and $C_{G1}$ are generated in feedback loops, discussed below, driven by error signal 148 to minimize RF distortion. In general, control signals $C_{G0}$ and $C_{G1}$ provide coefficients that scale bias signal 104 for use in two different legs of gate bias signal adjustment section 162. One leg is addressed to distortion term 48 (FIG. 1), in which first-order bias signals have intermodulated with the fundamental, and the other leg is addressed to distortion term 50 (FIG. 1), in which second-order bias signals have intermodulated with the fundamental. As indicated by ellipsis in FIG. 3, additional legs may also be included to address bias-induced-signal distortion of higher order terms.

The output from multiplier 166 passes through a delay element 170 to a first input of a combiner 172, and the output from multiplier 168 passes through a squaring circuit 174 to a second input of combiner 172. Thus, squaring circuit 174 has an input responsive to bias signal 104 and generates a bias-squared signal 176, and combiner 172 has an input responsive to bias signal 104. An output of combiner 172 generates a multi-ordered bias signal 178 which passes to a signal input of an adaptive equalizer 180. The precise form or configuration of equalizer 180 is not a critical parameter in the present invention. Desirably, equalizer 180 is configured to compensate for the modifications made to bias signal 104 in bias feed network 124 before being applied to RF amplifier 94. Accordingly, it has a complexity commensurate with the complexity of the impedance seen at the input of RF amplifier 94 when looking at RF amplifier 94, input matching network 92, and bias feed network 124. Desirably, equalizer 180 is a complex equalizer having an in-phase path driven by multi-ordered bias signal 178 and a quadrature path driven by multi-ordered bias signal 178. Adaptive equalizer 180 is controlled by any number of control signals, labeled $C_{G2}$-$C_{GN}$. Control signals $C_{G2}$-$C_{GN}$ are generated in feedback loops, discussed below, driven by error signal 148 to minimize RF distortion.

Adaptive equalizer 180 generates an equalized bias signal 182 which passes to a first input of a multiplier 184. An output of delay element 160 couples to a second input of multiplier 184. Thus, the first and second inputs of multiplier 184 are respectively responsive to bias signal 104 and to baseband communication signal 64. The delay imposed by delay element 160 is configured to temporally align baseband communication signal 64 with equalized bias signal 182 at multiplier 184. That delay accounts for the time needed to generate bias signal 104 within bias signal generator 108 as well as the time needed to generate equalized bias signal 182 from bias signal 104.

An output from multiplier 184 produces an adjusted bias signal 186 and also serves as the output from bias signal adjustment section 162. As the above-presented discussion indicated, adjusted bias signal 186 is responsive to gate bias signal 104 mixed with baseband communication signal 64. Moreover, a similar adjusted bias signal 188 is produced in bias signal adjustment section 164. But adjusted bias signal 188 is responsive to drain bias signal 106 mixed with baseband communication signal 64.

Adjusted bias signals 186 and 188 are each fed to a combiner 189 to produce a combined adjusted bias signal 190, and adjusted bias signal 190 is provided to a signal input of an adaptive equalizer 192. Error signal 148 is fed to a control input of adaptive equalizer 192. Adaptive equalizer 192 is desirably configured as a complex equalizer that adapts equalizer coefficients in response to an LMS-based, estimation-and-convergence algorithm. Adaptive equalizer 192 desirably estimates equalizer coefficient values that will influence the amount of bias-induced-signal distortion in amplified RF signal 126 output from RF amplifier 94, and then alters the coefficients over time in accordance with the LMS algorithm to achieve decreasing amounts of bias-signal-induced distortion until convergence is reached near a minimum amount of nonlinear distortion. The estimation-and-convergence algorithm is based upon feedback obtained from error signal 148.

Equalizer 192 generates an equalized form 194 of combined adjusted bias signal 190. Equalized adjusted bias signal 194 is fed to combiner 70 (FIG. 2), where it is combined into composite baseband signal 76, upconverted to RF in upconversion section 84, and then fed to RF amplifier 94. After passing through RF amplifier 94 it desirably cancels the bias-signal-induced distortion of terms 48 and 50 (FIG. 1).

As discussed above, adaptive equalizers 180 and multipliers 166 and 168 in each of bias signal adjustment sections 162 and 164 are responsive to control signals. A control section 195 of bias-induced distortion cancellation section 152 implements a feedback tracking loop for each of these control signals. Control section 195 processes feedback signal 134, as presented through error signal 148, to generate each control signal. The processing of control section 195 is configured so that adjustments made to bias signals 104 and 106 in bias signal adjustment sections 162 and 164 minimize the bias-signal-induced distortion of terms 48 and 50.

In the preferred embodiment, control section 104 implements a dithered linear search (DLS) algorithm in each of the tracking loops. Each tracking loop is driven in response to a different, orthogonal dither signal or sequence provided by a dither source 196. The dither signals are orthogonal to one another so that the influence of one dither signal may be distinguished from the influence of other dither signals and so that the tracking loops do not interfere with one another.

One distinct dither signal is provided by dither source 196 to a dithered linear search (DLS) controller 198 for each control signal. Error signal 148 is squared in a squaring circuit 200, which provides a squared-error signal 202 to each DLS controller 198. Each DLS controller 198 follows a DLS algorithm known to those skilled in the art to generate its control signal. In general, each DLS controller correlates the squared-error signal 202 with the respective dither signal, integrates the result over the length of the dither sequence, and combines the dither signal, preferably added to only a least significant bit, with the integrated result to form a control signal. While a DLS algorithm represents one form of a search algorithm which may be used by control section 195, those skilled in the art may devise other techniques to generate control signals so that bias signal adjustment sections 162 and 164 will adjust bias signals 104 and 106 to minimize bias-signal-induced distortion in amplified RF signal 126.

In summary, at least one embodiment of RF transmitter 60 provides an improved RF transmitter with bias-signal-induced distortion compensation and method of operating the RF transmitter. In at least one embodiment of RF transmitter 60 a variably biased RF transmitter and method are provided for use even in a high power, wide bandwidth application. In at least one embodiment a variably biased RF transmitter and method are provided which decouple, to a large degree, controls provided to improve power-added efficiency from controls provided to improve linearization. A wide range of bias signals may be devised to achieve power-added efficiency goals, and the bias-signal-induced RF distortion which results from the use of such a bias signal is cancelled in the amplified RF signal. In at least one embodiment of RF transmitter 60 an RF transmitter is configured to cancel distortion caused by the use of non-DC signals for biasing an RF power amplifier.

Although the preferred embodiments of the invention have been illustrated and described in detail, it will be readily apparent to those skilled in the art that various modifications may be made therein without departing from the spirit of the invention or from the scope of the appended claims. Such modifications and adaptations which are obvious to those skilled in the art are to be included within the scope of the present invention.

What is claimed is:

1. A radio-frequency (RF) transmitter compensated for bias-signal-induced distortion, said RF transmitter comprising:
   an RF amplifier having a variably biased operating point;
   a baseband communication signal source configured to supply a baseband communication signal;
   a bias signal generator having an input responsive to said baseband communication signal, said bias signal generator being configured to produce a bias signal for use in establishing said operating point, and said bias signal generator having an output coupled to said RF amplifier and configured to provide an analog form of said bias signal to said RF amplifier;
   a predistorter having an input coupled said bias signal generator and configured to receive a digital form of said bias signal, said predistorter being configured to produce a predistorted baseband communication signal; and
   an upconversion section having an input responsive to said predistorted baseband communication signal and an output coupled to said RF amplifier.

2. An RF transmitter as claimed in claim 1 wherein said predistorter comprises a multiplier having a first input responsive to said baseband communication signal, a second input responsive to said bias signal, and an output coupled to said upconversion section.

3. An RF transmitter as claimed in claim 2 additionally comprising an equalizer having in input coupled to said output of said multiplier and an output coupled to said upconversion section so that said upconversion section is responsive to an equalized form of said predistorted baseband communication signal.

4. An RF transmitter as claimed in claim 1 wherein said bias signal generator is configured so that said bias signal is a non-DC signal.

5. An RF transmitter as claimed in claim 1 wherein:
said RF amplifier generates an amplified RF signal which includes RF distortion;
said RF transmitter additionally comprises a feedback processor having an input coupled to said RF amplifier and having an output coupled to said predistorter.

6. An RF transmitter as claimed in claim 1 wherein:
said RF transmitter additionally comprises a bias feed network coupled between said bias signal generator and said RF amplifier so that said analog form of said bias signal is modified by said bias feed network before being applied to said RF amplifier; and
said predistorter is configured to compensate for modifications made to said analog form of said bias signal before being applied to said RF amplifier.

7. An RF transmitter as claimed in claim 1 wherein:
said RF amplifier has an input and an output; and
said output of said bias signal generator couples to said input of said RF amplifier.

8. An RF transmitter as claimed in claim 7 wherein said bias signal generator is a first bias signal generator, said bias signal is a first bias signal, and said RF transmitter additionally comprises:
a second bias signal generator having an input responsive to said baseband communication signal, said second bias signal generator being configured to produce a second bias signal for use with said first bias signal in establishing said operating point of said RF amplifier, and said second bias signal generator having an output coupled to said output of said RF amplifier and configured to provide an analog form of said second bias signal to said RF amplifier;
wherein said predistorter has an input coupled said second bias signal generator and configured to receive a digital form of said second bias signal and said predistorted baseband communication signal is additionally responsive to said second bias signal.

9. An RF transmitter as claimed in claim 1 wherein:
said baseband communication signal exhibits a first bandwidth; and
said bias signal generator is configured so that said bias signal is responsive to an envelope of said baseband communication signal and exhibits a second bandwidth which is less than said first bandwidth.

10. An RF transmitter as claimed in claim 1 wherein said bias signal generator is configured so that said bias signal varies in a manner that is responsive, but not linearly related, to said baseband communication signal.

11. An RF transmitter as claimed in claim 1 wherein:
said RF amplifier has an input and an output; and
said output of said bias signal generator couples to said output of said RF amplifier.

12. A method of operating a radio-frequency (RF) transmitter having an RF amplifier with a variably biased operating point to compensate for bias-signal-induced distortion, said method comprising:
providing a baseband communication signal;
generating a bias signal in response to said baseband communication signal, said bias signal being supplied in an analog form to said RF amplifier for use in establishing said operating point for said RF amplifier;
predistorting said baseband communication signal in a manner which responds to a digital form of said bias signal to produce a predistorted baseband communication signal;
upconverting said predistorted baseband communication signal to produce an RF signal; and
feeding said RF signal to said RF amplifier.

13. A method as claimed in claim 12 wherein:
said bias signal in said analog form is supplied to said RF amplifier through a bias feed network which causes said bias signal in analog form to be modified before being applied to said RF amplifier; and
said predistorting activity comprises compensating for modifications made to said analog form of said bias signal before said analog form of said bias signal is applied to said RF amplifier.

14. A method as claimed in claim 12 wherein:
said baseband communication signal exhibits a first bandwidth; and
said generating activity is configured so that said bias signal is responsive to an envelope of said baseband communication signal and exhibits a second bandwidth which is less than said first bandwidth.

15. A method as claimed in claim 12 wherein said generating activity is configured so that said bias signal varies in a manner that is responsive, but not linearly related, to said baseband communication signal.

16. A method as claimed in claim 12 wherein said generating activity is configured so that said analog form of said bias signal is supplied to an input of said RF amplifier.

17. A method as claimed in claim 12 wherein said generating activity is configured so that said analog form of said bias signal is supplied to an output of said RF amplifier.

18. A method of operating a radio-frequency (RF) transmitter having an RF amplifier with an input and with an output that provides an amplified RF signal having bias-signal-induced RF distortion responsive to a variably biased operating point, said method comprising:
providing a baseband communication signal;
generating a first bias signal in response to said baseband communication signal, said first bias signal being supplied in an analog form to said input of said RF amplifier;
generating a second bias signal in response to said baseband communication signal, said second bias signal being supplied in an analog form to said output of said RF amplifier, wherein said first and second bias signals establish said variably biased operating point for said RF amplifier;
generating a feedback signal which is responsive to said amplified RF signal;
forming a composite baseband signal which is responsive to said first adjusted bias signal, said second adjusted bias signal, and to said baseband communication signal;
predistorting said baseband communication signal in a manner which responds to a digital form of said first and second bias signals to produce a predistorted baseband communication signal;
upconverting said predistorted baseband communication signal to produce an RF signal; and
feeding said RF signal to said RF amplifier.

* * * * *